US009184176B2

(12) United States Patent
Lee

(10) Patent No.: US 9,184,176 B2
(45) Date of Patent: Nov. 10, 2015

(54) SEMICONDUCTOR DEVICE, MEMORY SYSTEM INCLUDING THE SAME, AND METHOD OF MANUFACTURING THE SAME

(71) Applicant: SK hynix Inc., Gyeonggi-do (KR)

(72) Inventor: Sang Bum Lee, Incheon (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/477,522

(22) Filed: Sep. 4, 2014

(65) Prior Publication Data

US 2014/0370676 A1 Dec. 18, 2014

Related U.S. Application Data

(62) Division of application No. 13/600,020, filed on Aug. 30, 2012, now Pat. No. 8,853,773.

(30) Foreign Application Priority Data

Jun. 13, 2012 (KR) .......................... 10-2012-0063204

(51) Int. Cl.
*H01L 27/115* (2006.01)
*H01L 29/66* (2006.01)

(52) U.S. Cl.
CPC .... *H01L 27/11582* (2013.01); *H01L 27/11568* (2013.01); *H01L 29/66666* (2013.01); *H01L 29/66833* (2013.01)

(58) Field of Classification Search
CPC ................... H01L 27/11582; H01L 27/11556; H01L 29/66833; H01L 27/11551; H01L 27/11578
See application file for complete search history.

(56) References Cited

U.S. PATENT DOCUMENTS

2011/0233646 A1* 9/2011 Mizushima et al. .......... 257/324
2011/0298037 A1* 12/2011 Choe et al. .................... 257/324

* cited by examiner

*Primary Examiner* — Whitney T Moore
(74) *Attorney, Agent, or Firm* — IP & T Group LLP

(57) ABSTRACT

The semiconductor device includes a vertical channel layer formed on a substrate; conductive layer patterns and insulating layer patterns alternately formed around a length of each of the vertical channel layer; and a charge storing layer pattern formed between each of the vertical channel layers and the conductive layer patterns, where each of the charge storing layer patterns is isolated by the insulating layer patterns.

13 Claims, 11 Drawing Sheets

SEMICONDUCTOR DEVICE, MEMORY SYSTEM INCLUDING THE SAME, AND METHOD OF MANUFACTURING THE SAME

CROSS-REFERENCE TO RELATED APPLICATIONS

This application is a division of U.S. patent application Ser. No. 13/600,020 filed on Aug. 30, 2012, which claims priority from Korean Patent Application No. 10-2012-0063204, filed on Jun. 13, 2012, with the Korean Intellectual Property Office. The disclosure of each of the foregoing application is incorporated herein in its entirety by reference.

BACKGROUND

The present invention relates to a semiconductor device, a memory system including the semiconductor device, and a method of manufacturing the semiconductor device, and more particularly to a 3-Dimensional (3D) semiconductor device, a memory system including the 3D semiconductor device, and a method of manufacturing the 3D semiconductor device.

Generally, in order to improve the integration degree of the semiconductor device, methods of decreasing sizes of 2-dimensionally arranged memory cells have been developed.

There is a limitation in decreasing the sizes of the 2-dimensionally arranged memory cells. In order to overcome the limitation, a 3D semiconductor device in which memory cells are 3-dimensionally arranged on a substrate has been suggested. The 3D semiconductor device may efficiently utilize an area of the substrate and improve an integration degree compared to a case in which the memory cells are 2-dimensionally arranged. However, reliability of the 3D semiconductor device is lower than that of the 2D semiconductor device due to various reasons, so that the improvement of the reliability of the 3D semiconductor device has been demanded.

SUMMARY

The present invention has been made in an effort to provide a semiconductor device having improved reliability, a memory system including the semiconductor device, and a method of manufacturing the semiconductor device.

An exemplary embodiment of the present invention provides a semiconductor device including: vertical channel layers formed on a substrate; conductive layer patterns and insulating layer patterns alternately formed around a length of each of the vertical channel layers; and a charge storing layer pattern formed between each of the vertical channel layers and each of the conductive layer patterns, where each of the charge storing layer patterns is isolated by the insulating layer patterns.

Another exemplary embodiment of the present invention provides a memory system including: a semiconductor memory device including vertical channel layers formed on a substrate, conductive layer patterns and insulating layer patterns alternately formed around a length of each of the vertical channel layers, and a charge storing layer pattern formed between each of the vertical channel layers and each the conductive layer patterns, where each of the charge storing layer patterns is isolated by the insulating layer patterns; and a memory controller configured to control the semiconductor memory device.

Another exemplary embodiment of the present invention provides a method of manufacturing a semiconductor device, including: alternatively forming first material layers and second material layers to form a stacked structure; forming channel holes extending through the stacked structure, the channel holes including sidewalls; forming a charge storing layer on the side calls of the channel holes; forming vertical channel layers, inside the channel holes on the charge storing layer forming a slit by etching the stacked structure between the vertical channel layers; and forming insulating layer trenches separating the charge storing layer into a plurality of patterns by removing the second material layers, and the portion of charge storing layer, exposed through the slit.

DETAILED DESCRIPTION

Hereinafter, an exemplary embodiment of the present invention will be described with reference to the accompanying drawings in detail. However, the present invention is not limited to an embodiment disclosed below and may be implemented in various forms. The embodiment is provided only for illustrative purposes and for full understanding of the scope of the present invention by those skilled in the art. The scope of the present invention will be understood by the claims of the present invention.

FIGS. 1A to 1H are cross-sectional views illustrating a semiconductor device and a method of manufacturing the semiconductor device according to a first embodiment of the present invention.

Figure 1A:
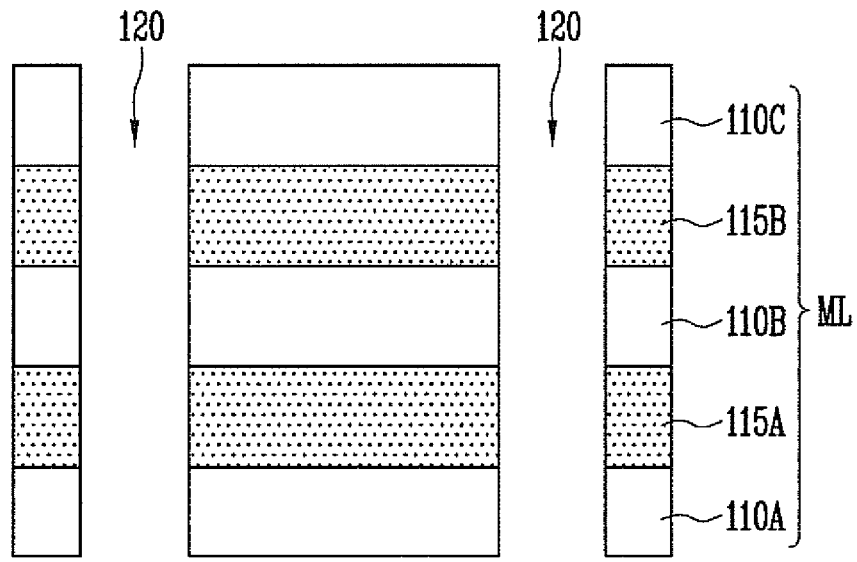
FIGS. 1A to 1H are cross-sectional views illustrating a semiconductor device and a method of manufacturing the semiconductor device according to a first embodiment of the present invention.

Referring to FIG. 1A, a stacked structure ML is formed by alternately stacking first material layers 110A to 110C and second material layers 115A and 115B. The first material layers 110A to 110 are formed in layers in which conductive layer patterns are to be formed, and the second material layers 115A and 115B are formed in layers in which insulating layer patterns are to be formed. The first material layers 110A to 110C may be formed of a material layer having a great etch selectivity to the second material layers 115A and 115B in a subsequent etching process for forming insulating layer trenches. For example, the first material layers 110A to 110C may be formed of an oxide layer and the second material layers 115A and 115B may be formed of a nitride layer. Otherwise, the first material layers 110A to 110C may be conductive layers and the second material layers 115A and 115B may be sacrificial layers. The first material layers 110A to 110C serving as the conductive layers may be metal layers or doped poly silicon layers and the second material layers 115A and 115B serving as the sacrificial layers may be undoped poly silicon layers. The number of stacked first and second material layers 110A to 110C, and 115A and 115B constituting the stacked structure ML may be variously set according to the number of stacked insulating layer patterns and conductive layer patterns desired to be formed.

After the forming of the stacked structure ML, the first material layers 110A to 110C and the second material layers 115A and 115B are etched. Accordingly, channel holes 120 extending through the stacked structure ML are formed while extending in the same direction as a stacked direction of the first and second material layers 110A to 110C and 115A and 115B. The channel holes 120 may be arranged in a matrix form including multiple rows and multiple columns.

Figure 1B:
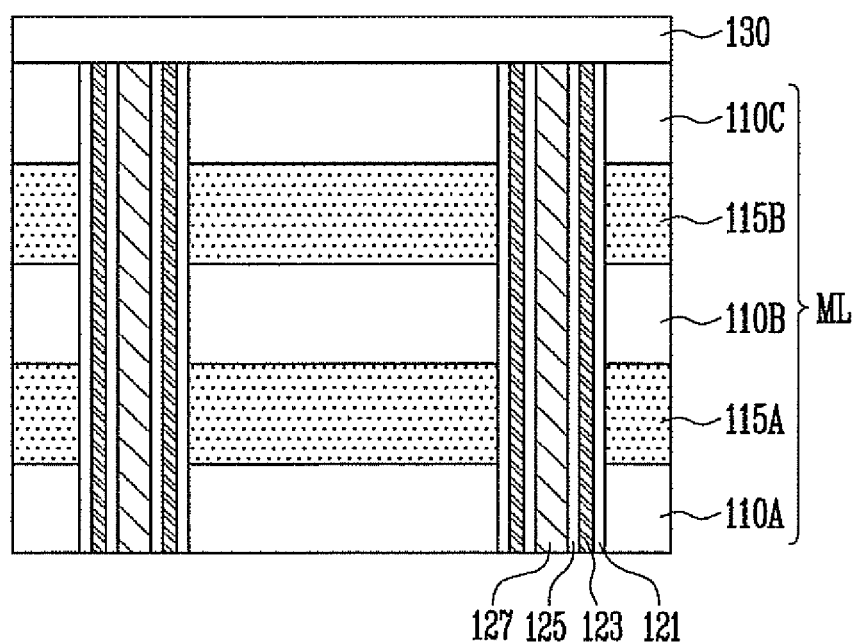

Referring to FIG. 1B, a first blocking insulation layer 121, a charge storing layer 123, and a tunnel insulating layer 125 are sequentially formed along surfaces of the channel holes 120. Then, a channel layer 127 is formed inside the channel holes 120. The first blocking insulation layer 121 and the tunnel insulating layer 125 may be formed of a silicon oxide layer, and the charge storing layer 123 may be formed of a silicon nitride layer in which a charge trapping is possible. The channel layer 127 may be formed of a semiconductor material, for example, a poly silicon layer.

Then, a planarization process is performed until a top surface of the stacked structure ML is exposed. Accordingly, the first blocking insulation layer 121, the charge storing layer 123, the tunnel insulating layer 125, and the channel layer 127 formed on the top surface of the stacked structure ML are removed. The planarization process is performed in such a manner that the first blocking insulation layer 121, the charge storing layer 123, and the tunnel insulating layer 125 remain inside the channel holes 120 along an entire surface of side walls of the channel holes 120. The channel layer 127 also remains inside the channel holes 120. FIG. 1B illustrates an example in which the inside of the channel hole 120 is completely buried by the channel layer 127, but the channel layer 127 may be formed along an inner wall surface of the channel hole 120 and be formed in a hollow tube shape. In this case, an inside of the tube-shaped channel layer 127 may be further filled with an insulating layer.

Next, a mask layer 130 is formed on the stacked structure ML. The mask layer 130 may be formed of a material layer having a great etch selectivity to the first material layers 110A to 110C and the second material layers 115A and 115B. For example, the mask layer 130 may be formed of a poly silicon layer.

Figure 1C:
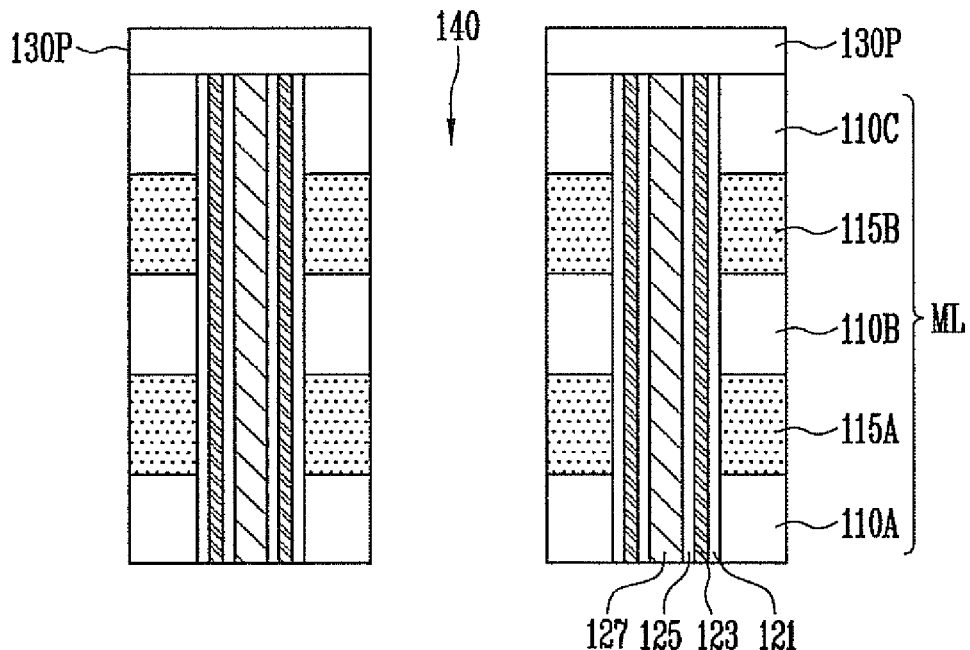

Referring to FIG. 1C, mask patterns 130P exposing the stacked structure ML between the channel layers 127 are formed by etching the mask layer 130. The mask patterns 130P define a region in which a slit 140 is formed. The slit 140 exposing side walls of the first material layers 110A to 110C and the second material layers 115A and 115B while extending through the stacked structure ML is formed by etching the stacked structure ML between the adjacent channel layers 127 with the mask pattern 130P as an etch barrier.

Figure 1D:
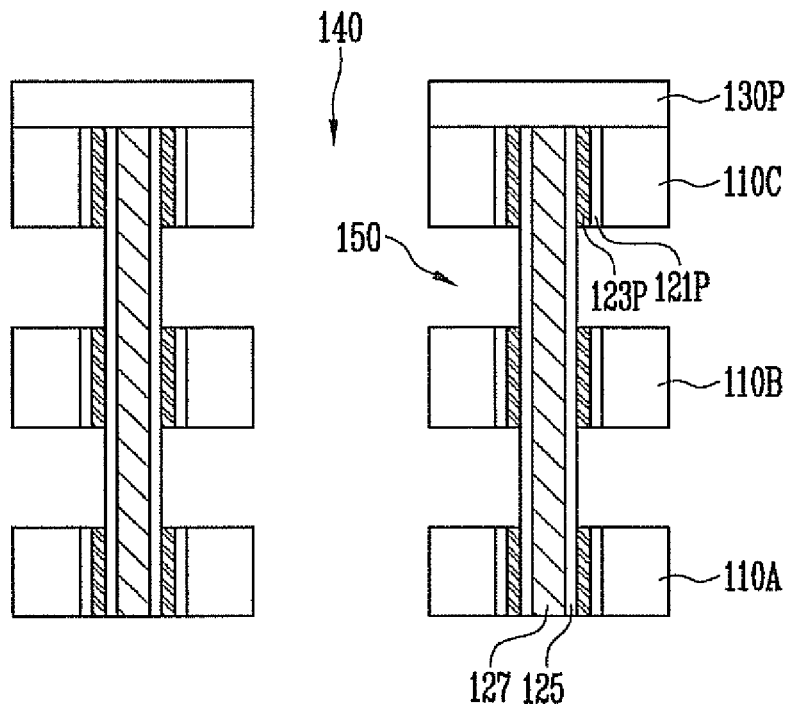

Referring to FIG. 1D, the first blocking insulation layer 121 is exposed by removing the second material layers 115A and 115B exposed through the slit 140. Then, the exposed first blocking insulation layer 121 is etched. As a result, first blocking insulation layer patterns 121P remain on the side walls of the first material layers 110A to 110C and the charge storing layer 123 is exposed. Next, the exposed charge storing layer 123 is etched. As a result, charge storing layer patterns 123P remain over the side walls of the first material layers 110A to 110C and the tunnel insulating layer 125 is exposed. Insulating layer trenches 150 are formed in regions in which the second material layers 115A and 115B, the first blocking insulation layer 121, and the charge storing layer 123 are etched. The charge storing layer patterns 123P is not only isolated from each other but the first blocking insulation layer patterns 121P are isolated from each other by the insulating layer trenches 150.

Figure 1E:
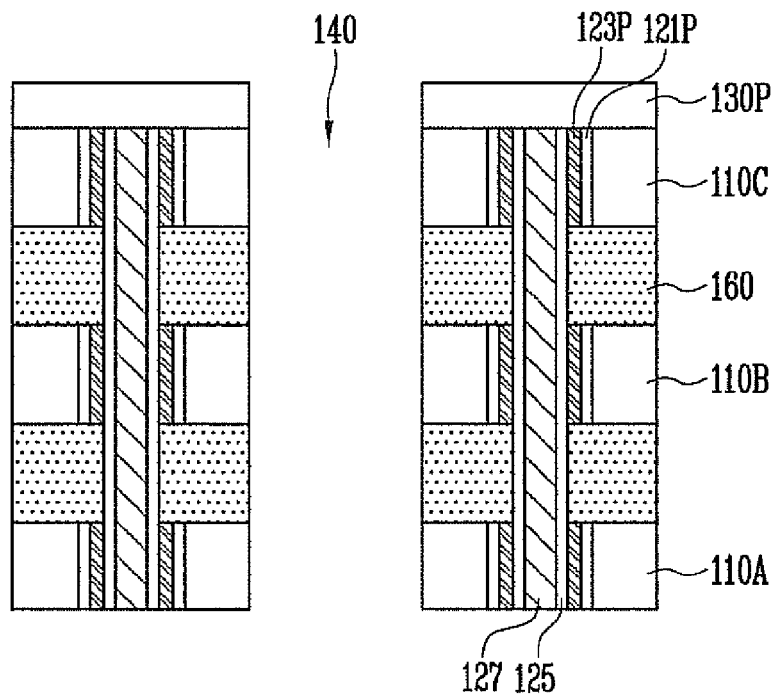

Referring to FIG. 1E insulating layer patterns 160 are formed by filling insides of the insulating layer trenches 150 with an insulating layer. The charge storing layer patterns 123P formed on the different layers are isolated by the insulating layer patterns 160.

When the first material layers 110A to 110C are formed as the conductive layer, the conductive layer patterns formed of the first material layers 110A to 110C may be isolated by the insulating layer patterns 160. In this case, the insulating layer patterns 160 may be formed of an oxide layer, and an insulating material of the insulating layer patterns 160 may be further filled in the Inside of the slit 140.

Differently from the aforementioned description, when the first material layers 110A to 110C are formed of an insulating material, such as an oxide layer, the insulating layer patterns 160 may be formed of a material' layer having a great etch selectivity to the first material layers 110A to 110C in a subsequent etching process for forming conductive layer trenches. For example, the insulating layer patterns 150 may be formed of the same material layer as those of the second material layers 115A and 115B, and more particularly, may be formed of a nitride layer. In this case, the process of forming the insulating layer patterns 160 may further include forming an insulating layer so as to fill the insulating layer trenches 150 and then exposing the first material layers 110A to 110C by removing the insulating layer formed in the inside of the slit 140.

Hereinafter, subsequence processes after the forming of the insulating layer patterns 160 when the first material layers 110A to 110C are formed of an insulating material will be described with reference to FIGS. 1F to 1H.

Figure 1F:
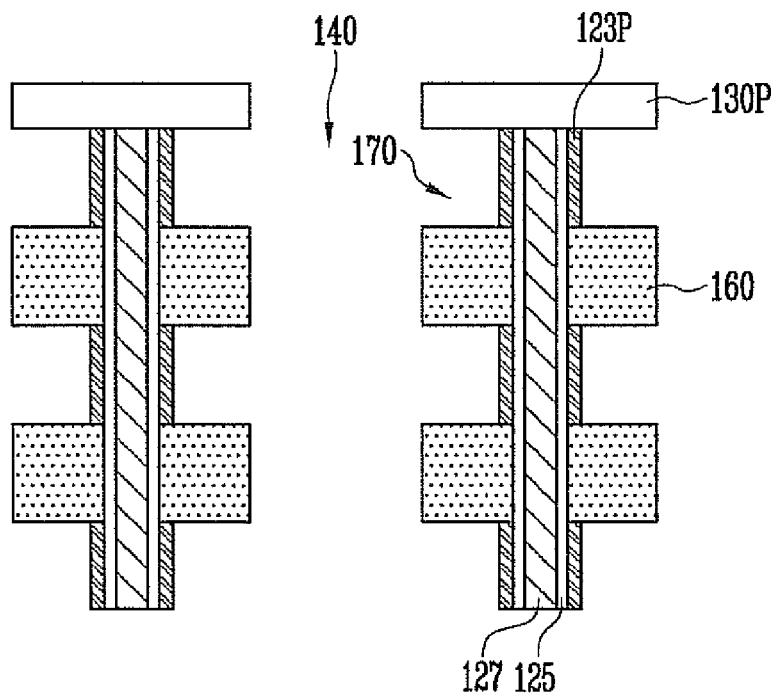

Referring to FIG. 1F, when the first material layers 110A to 110C are the insulating material, a process of forming conductive layer trenches 170 by removing the first material layers 110A to 110C exposed through the slit 140 is further performed. The first blocking insulation layer 121 may be etched during the etching process for forming the conductive layer trenches 170, so that the charge storing layer patterns 123P may be exposed.

Figure 1G:
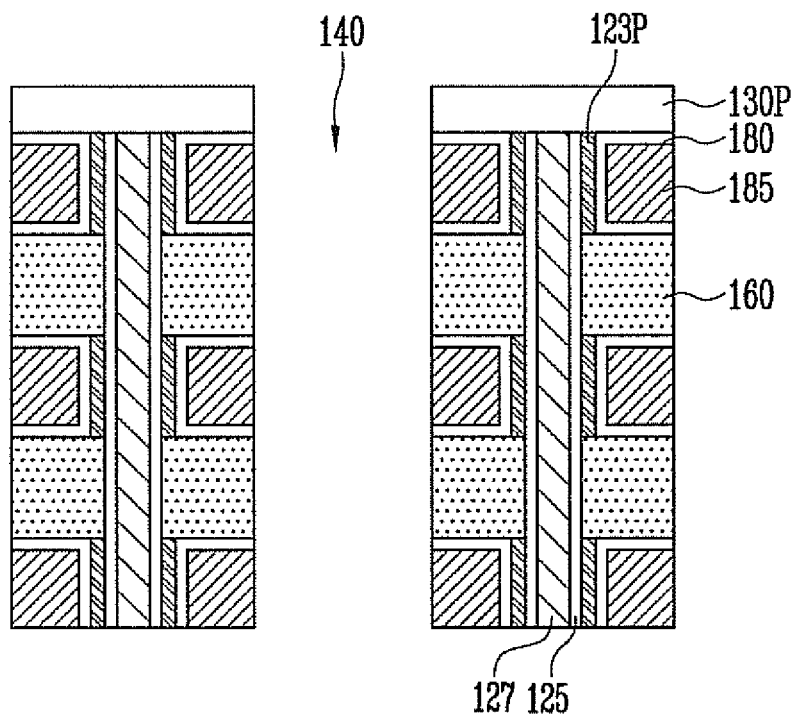

Referring to FIG. 1G, conductive layer patterns 185 isolated by the insulating layer patterns 160 are formed by filling insides of the conductive layer trenches 170 with a conductive layer. When the charge storing layer patterns 123P are exposed in the etching process for forming the conductive layer trenches 170 and second blocking insulation layers 180 may be further formed along surfaces of the conductive layer trenches 170 before the forming of the conductive layer. Differently from this, when the blocking insulation layer 121 remains in side walls of the conductive layer trenches 170, a process of forming the second blocking insulation layer 180 will be omitted. The second blocking insulation layer 180 may be formed of a silicon oxide layer.

The process of forming the conductive layer patterns 185 may further include a process of removing the conductive layer formed in the inside of the slit 140 after forming the conductive layer in such a manner that the conductive layer trenches 170 are filled with the conductive layer.

Figure 1H:
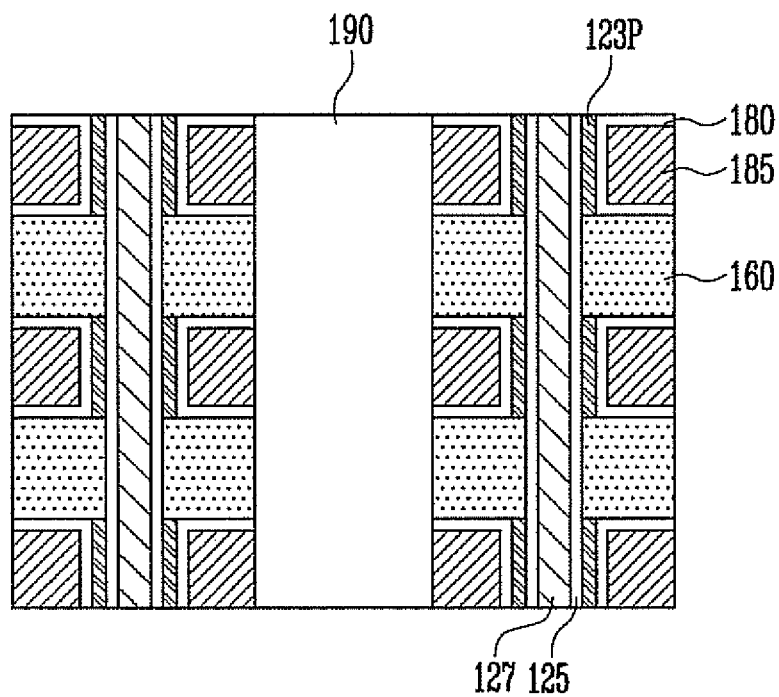

Referring to FIG. 1H, an insulating layer 190 is filled in the inside of the slit 140. The insulating layer 190 may be formed of an oxide layer.

Through the aforementioned processes, the semiconductor device, which includes a channel layer 127 extending in one direction, the insulating layer patterns 160 and the conductive layer patterns 185 alternately stacked while surrounding the channel layer 127, and the charge storing layer patterns 123P isolated by the insulating layer patterns 160 and extending in one direction, is formed. Memory cells may be formed in intersections of the charge storing layer patterns 123P and the conductive layer patterns 185.

The charge storing layer patterns 123P according to the first embodiment of the present invention are formed while being separated for each layer. Accordingly, in the first embodiment of the present invention, it is possible to prevent movement of a charge to an adjacent cell along the charge storing layer patterns 123P. Accordingly, the present invention according to the first embodiment may improve reliability of the semiconductor device.

Further, according to the first embodiment of the present invention, in order to separate the charge storing layer 123 into the plurality of patterns, a series of processes of forming the charge storing layer 123 along the side wall of the channel hole 120, removing a part of the stacked structure ML through the slit 140 such that a part of the charge storing layer 123 is exposed, and then etching the charge storing layer 123 exposed according to the removal of the part of the stacked structure ML is performed. Through the processes, it is possible to easily separate the charge storing layer 123 into the plurality of charge storing layer patterns 123P and it is not necessary to separately form a space in which the charge storing layer patterns 123P are to be formed. Accordingly, according to the first embodiment of the present invention, it is possible to separate the charge storing layer 123 into the plurality of charge storing layer patterns 123P without an increase in a size of the semiconductor device. Further, according to the first embodiment of the present invention, the respective charge storing layer patterns 123P are formed in one direction along the side walls of the channel holes 120, so that the charge storing layer patterns 123P are not bent and are not shaped like irregularities.

FIGS. 2A to 2D are cross-sectional views illustrating a semiconductor device and a method of manufacturing the semiconductor device according to a second embodiment of the present invention. Hereinafter, the repeated description and the same effect as that of the first embodiment of the present invention will be omitted.

Figure 2A:
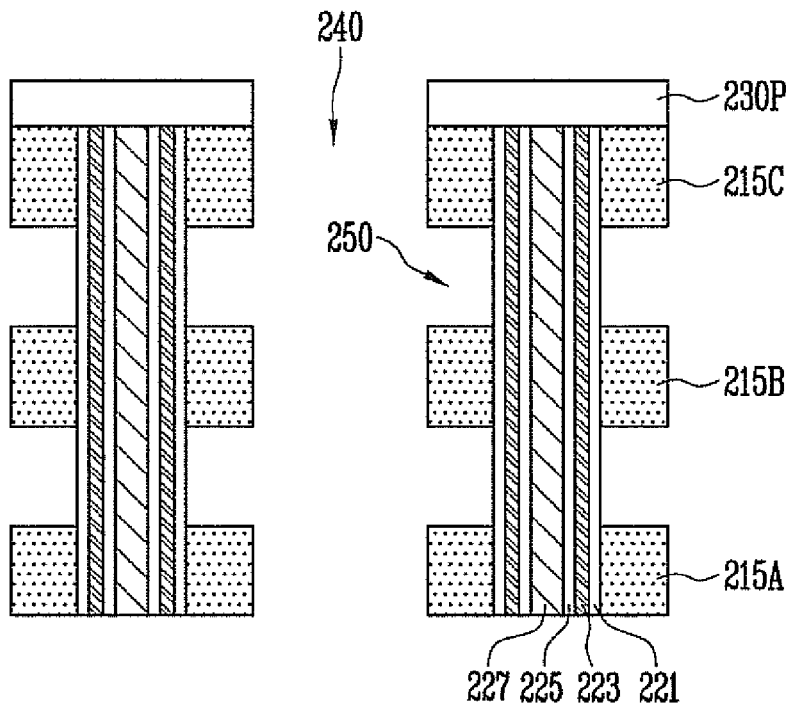
FIGS. 2A to 2D are cross-sectional views illustrating a semiconductor device and a method of manufacturing the semiconductor device according to a second embodiment of the present invention.

Referring to FIG. 2A, a stacked structure is formed by alternately stacking first material layers (not shown) and second material layers 215A to 215C identically to the description of FIG. 1A. The first material layers are formed in a layer in which conductive layer patterns are to be formed, and the 215A to 215C are formed in a layer in which insulating layer patterns are to be formed. The first material layers may be formed of a material layer having a great etch selectivity to the second material layers 215A to 215C in a subsequent etching process for forming conductive layer trenches 250. For example, the first material layers may be formed of a nitride layer and the second material layers 215A to 215C may be formed of an oxide layer.

Then, a channel hole, a first blocking insulation layer 221, a charge storing layer 223, a tunnel insulating layer 225, and a channel layer 227 are formed in the same manner as that described with reference to FIGS. 1A and 1B. Subsequently, a mask patterns 230P are formed and a slit 240 is formed by etching a stacked structure with the mask patterns 230P as an etch barrier in the same manner as that described with reference to FIG. 1C.

Next the conductive layer trenches 250 are formed by etching process removing the first material layers exposed through the slit 240. The conductive layer trenches 250 are formed to expose the first blocking insulation layer 221.

Figure 2B:
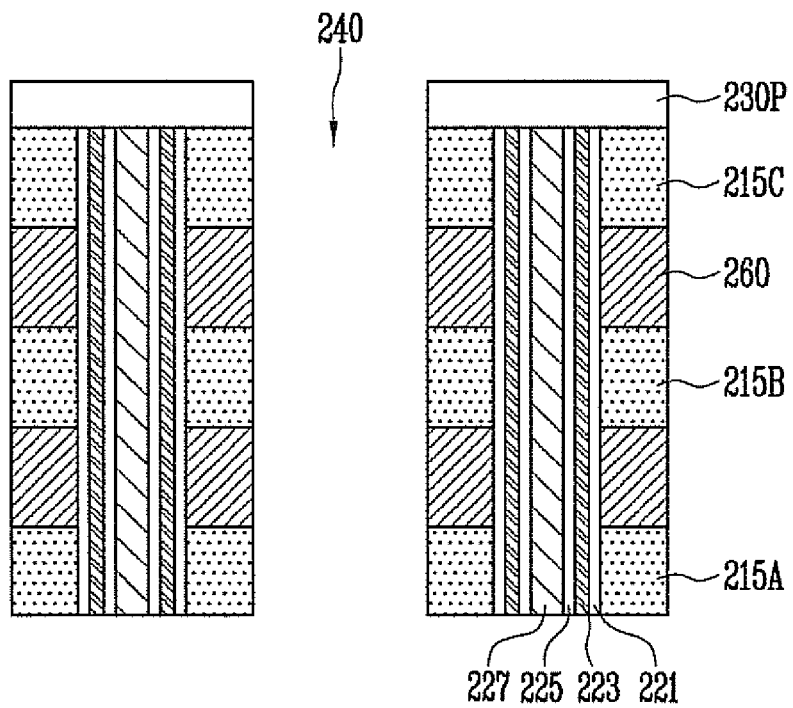

Referring to FIG. 2B, conductive layer patterns 260 isolated by the second material layers 215A to 215C are formed by filling insides of the conductive layer trenches 250 with a conductive layer.

Figure 2C:
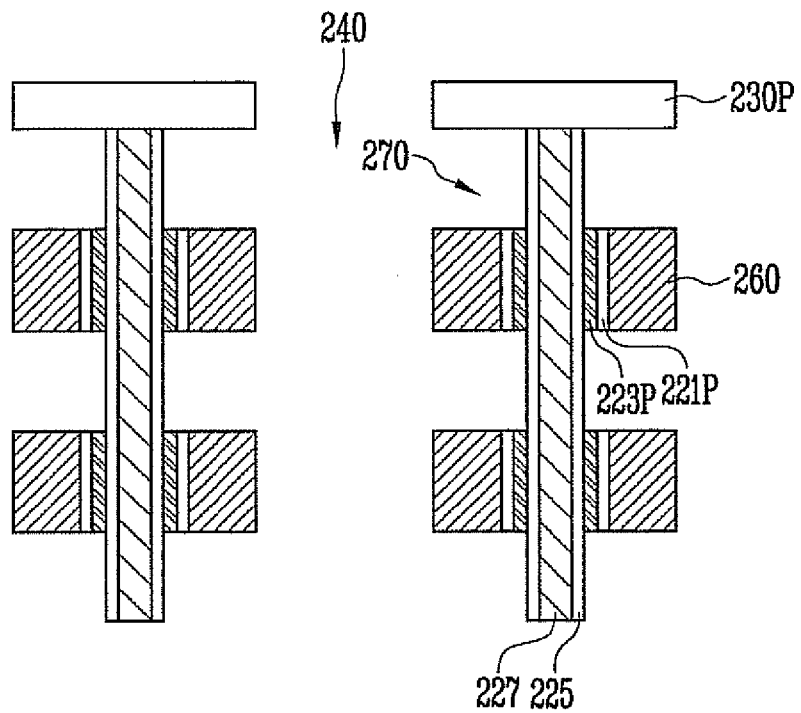

Referring to FIG. 2C, insulating layer trenches 270 are formed by etching the second material layers 215A to 215C, the first blocking insulation layer 221 and the charge storing layer 223 exposed through the slit 240 in the same manner as that described with reference to FIG. 1D. As a result, first blocking insulation layer patterns 221P and charge storing layer patterns 223P are formed. The tunnel insulating layer 225 is exposed and the charge storing layer patterns 223P are isolated by the insulating layer trenches 270.

Figure 2D:
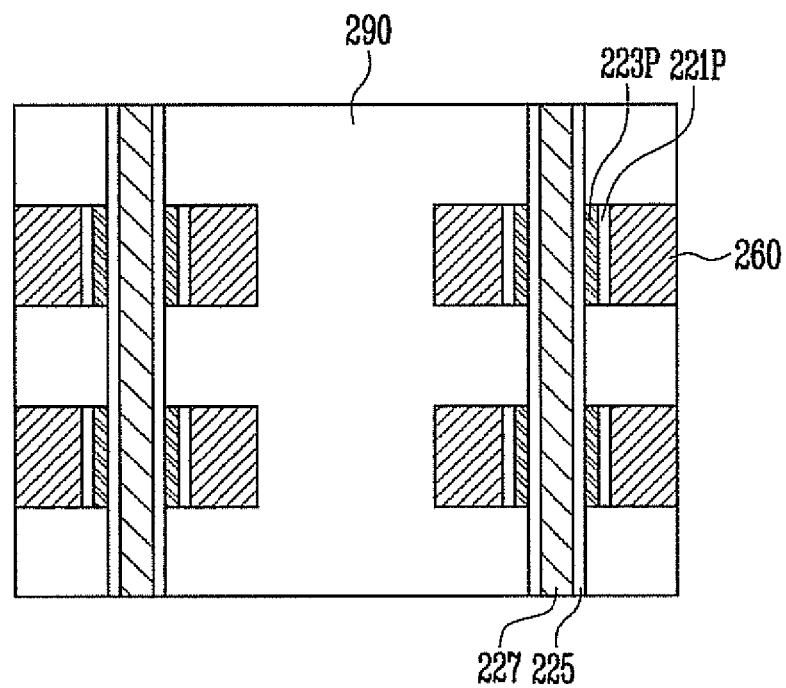

Referring to FIG. 2D, the insulating layer trenches 270 and the slit 240 are filled with an insulating layer 290. The insulating layer 290 may be formed of an oxide layer.

Figure 3:
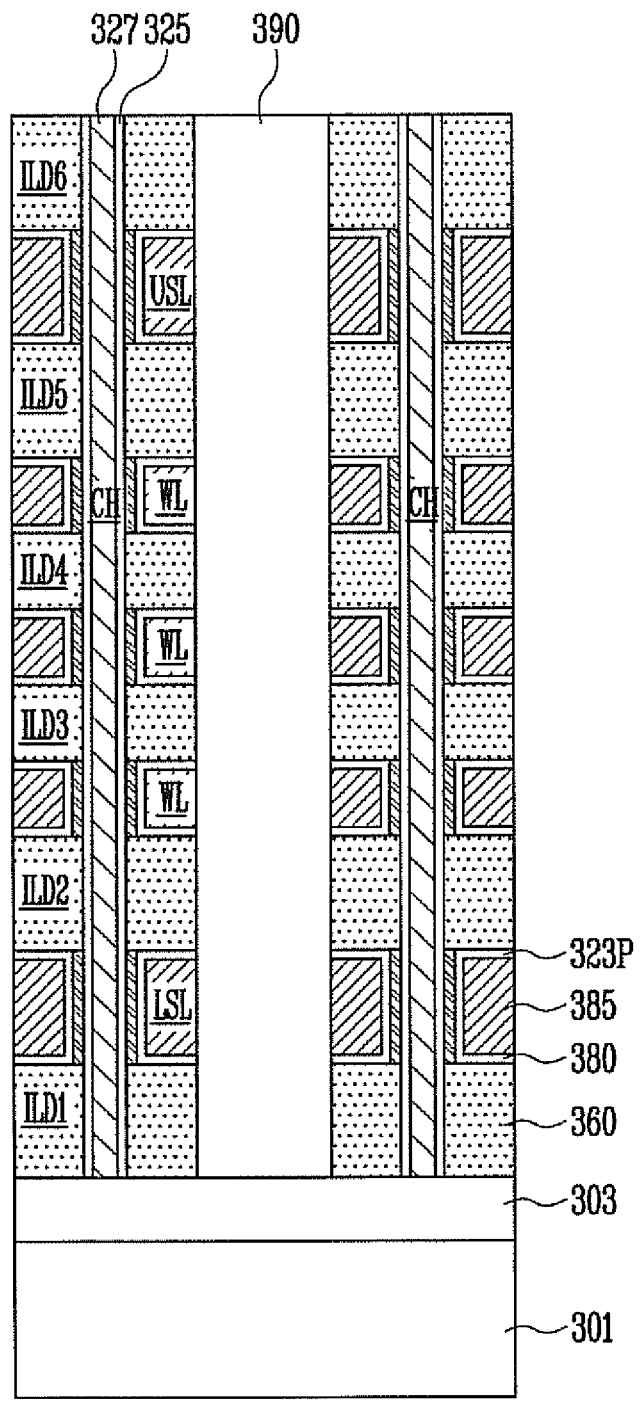
FIG. 3 is a cross-sectional view illustrating a semiconductor device and a method of manufacturing the semiconductor device according to a third embodiment of the present invention.

FIG. 3 is a cross-sectional view illustrating a semiconductor device and a method of manufacturing the semiconductor device according to a third embodiment of the present invention.

Referring to FIG. 3, a semiconductor device according to the third embodiment of the present invention includes vertical channel layers CH protruding from an upper part of a substrate 301. A bottom surface of the vertical channel layer CH is connected to a source region 303 of the substrate 301. The vertical channel layer CH is formed of a semiconductor layer 327, for example, a poly silicon layer. An entire surface of a side wall of the vertical channel layer CH is surrounded by a tunnel insulating layer 325. The tunnel insulating layer 325 may be formed of a silicon oxide layer.

The vertical channel layer CH surrounded by the tunnel insulating layer 325 is surrounded by conductive lines LSL, WL, and USL, and insulating layer patterns ILD1 to ILD6. The conductive lines LSL, WL, and USL are formed as a conductive layer 385. The insulating layer patterns ILD1 to ILD6 are formed as an insulating layer 360, and may be formed of an oxide layer or a nitride layer. The conductive lines LSL, WL, and USL, and the insulating layer patterns ILD1 to ILD6 are alternately stacked along the vertical channel layer CH.

At least one conductive layer LSL from a topmost layer and at least one conductive line USL from a bottommost layer among the conductive lines LSL, WL, and USL may be used as a select line of a select transistor, and the conductive lines WL between the select lines LSL and USL may be used as word lines of the memory cells.

Charge storing layer patterns 323P may be formed between the tunnel insulating layer 325 and the conductive lines LSL, WL, and USL. The charge storing layer patterns 323P are isolated by insulating layer patterns ILD1 to ILD6 and extend in one direction. The extension direction of the charge storing layer patterns 323P may be the same as that of the vertical channel layer CH.

Blocking insulation layers 380 may be further formed between the charge storing layer patterns 323P and the conductive lines LSL, WL, and USL. The blocking insulation layer 380 may be further formed between the insulating layer patterns ILD1 to ILD6 and the conductive lines LSL, WL, and USL. The blocking insulation layer 380 may be formed of a silicon oxide layer.

An insulating layer 390 is further formed between the adjacent vertical channel layers CH. The insulating layer 390 may be formed of an oxide layer.

Select transistors are formed in intersections between the select lines LSL and USL and the vertical channel layer CH, and the memory cells are formed in intersections between the word lines WL and the vertical channel layer CH. Accordingly, the memory cells are connected between the select transistors in series by the vertical channel layer CH, thereby being capable of configuring a memory string.

The semiconductor device according to the third embodiment of the present invention may be formed by performing the same processes as those described with reference to FIGS. 1A to 1H after forming a source region 303 by injecting an impurity into the inside of the substrate 301. The source region 303 may be exposed in the step of forming the channel hole aforementioned with reference to FIG. 1A such that the source region 303 may be connected to the vertical channel layer CH.

Figure 4:
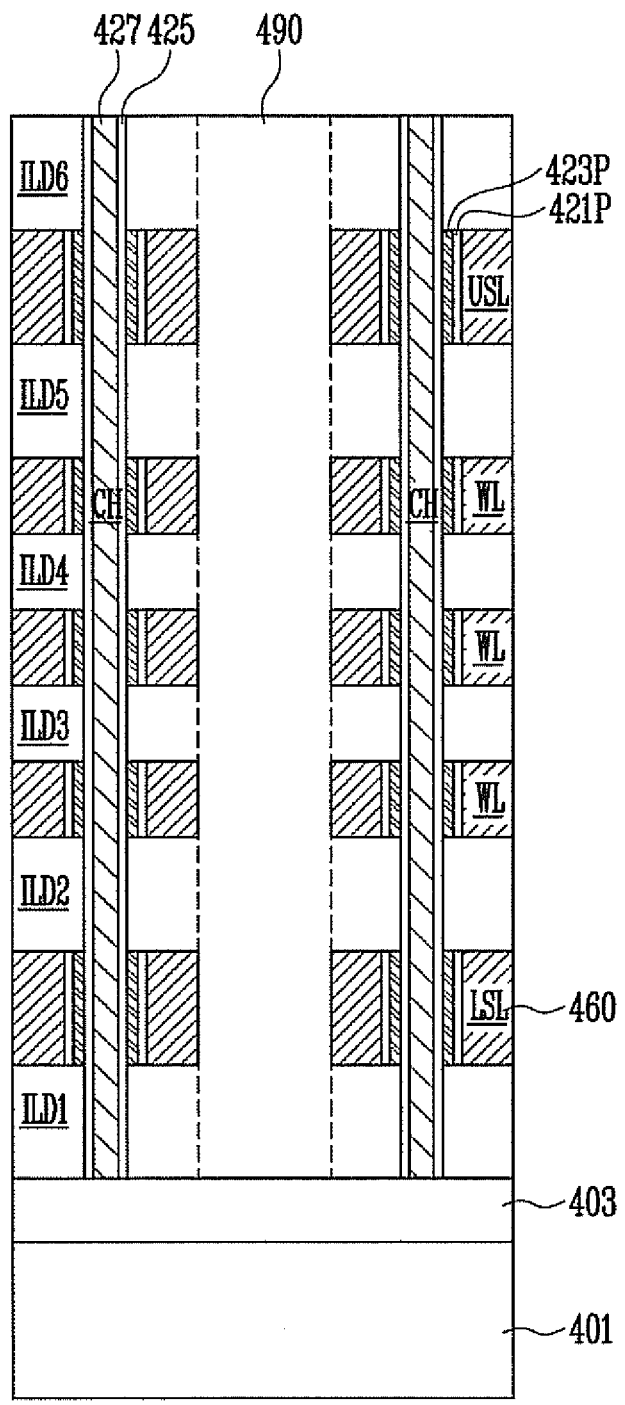
FIG. 4 is a cross-sectional view illustrating a semiconductor device and a method of manufacturing the semiconductor device according to a fourth embodiment of the present invention.

FIG. 4 is a cross-sectional view illustrating a semiconductor device and a method of manufacturing the semiconductor device according to a fourth embodiment of the present invention.

Referring to FIG. 4, an insulating material constituting the insulating layer patters ILD1 to ILD6 and an insulating material formed between the adjacent vertical channels CH are formed as an identical insulating layer 490. The insulating layer 490 may be formed of an oxide layer. In the fourth embodiment of the present invention, blocking insulation layer patterns 421P are isolated by insulating layer patterns ILD1 to ILD6 and are formed between the conductive lines LSL, WL, and USL, and the charge storing layer patterns 423P. In the fourth embodiment of the present invention, the source region 403, the vertical channel layer CH formed of the semiconductor material 427, the tunnel insulating layer 425, the conductive lines LSL, WL, and USL formed as the conductive layer 460, and the charge storing layer patterns 423P are the same as those of the third embodiment.

The semiconductor device according to the fourth embodiment of the present invention may be formed by performing the same processes as those described with reference to FIGS. 2A to 2D after forming a source region 403 by injecting an impurity into the inside of a substrate 401. The source region 403 may be exposed in the step of forming the channel hole aforementioned with reference to FIG. 3A such that the source region 403 may be connected to the vertical channel layer CH.

Figure 5:
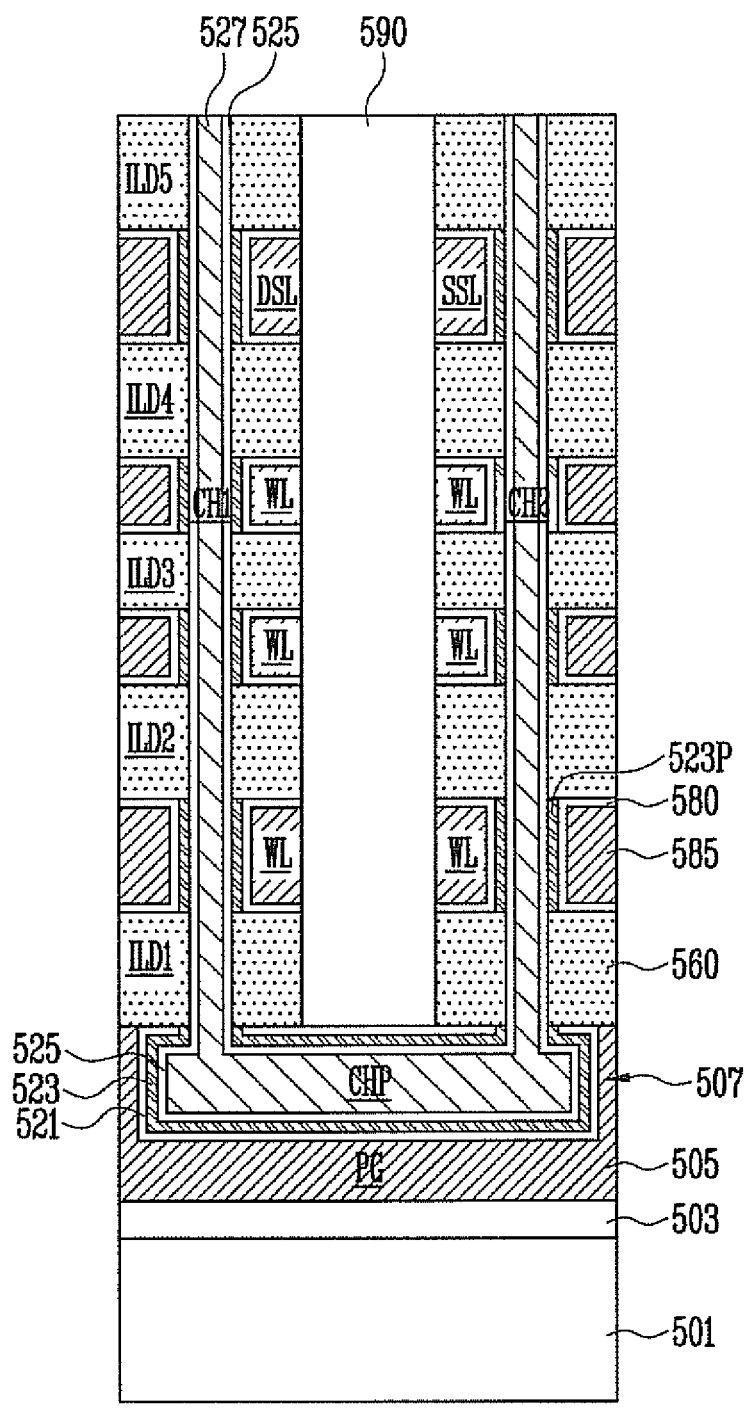
FIG. 5 is a cross-sectional view illustrating a semiconductor device and a method of manufacturing the semiconductor device according to a fifth embodiment of the present invention.

FIG. 5 is a cross-sectional view illustrating a semiconductor device and a method of manufacturing the semiconductor device according to a fifth embodiment of the present invention.

Referring to FIG. 5, the semiconductor device according to the fifth embodiment of the present invention includes a pair of vertical channel layers CH1 and CH2 extending in a direction of an upper part of a substrate 501. The pair of vertical channel layers CH1 and CH2 is coupled to a pipe channel layer CHP. The pair of vertical channel layers CH1 and CH2 and the pipe channel layer CHP may be formed of a semiconductor material 527, for example, a poly silicon layer.

Entire surfaces of side walls of the pair of vertical channel layers CH1 and CH2 and the pipe channel layer CHP are surrounded by a tunnel insulating layer 525 that is a first oxide layer. The tunnel insulating layer 525 may be formed of a silicon oxide layer.

The pipe channel layer CHP surrounded by the tunnel insulating layer 525 is surrounded by a charge storing layer pattern 523. A blocking insulation layer pattern 521 is formed along a surface of the charge storing layer pattern 523 and is a second oxide layer. Further, the pipe channel layer CHP is surrounded by the pipe gate PG with an interposed gate insulating layer pattern formed of the tunnel insulating layer 525, the charge storing layer pattern 523, and the blocking insulation layer pattern 521. The pipe gate PG is formed on the substrate 501 and formed as the conductive layer 505. An insulating layer 503 may be further formed between the substrate 501 and the pipe gate PG in order to isolate the substrate 501 and the pipe gate PG.

The pair of vertical channel layers CH1 and CH2 surrounded by the tunnel insulating layer 525 is formed while protruding from an upper part of the pipe gate PG. The first vertical channel layer CH1 of the pair of vertical channel layers CH1 and CH2 surrounded by the tunnel insulating layer 525 are surrounded by the conductive lines DSL and WL and the insulating layer patterns ILD1 to ILD6. The conductive lines DSL and WL and the insulating layer patterns ILD1 to ILD6 are alternately stacked in an extending direction of the first vertical channel layer CH1. The second vertical channel layer CH2 of the pair of vertical channel layers CH1 and CH2 surrounded by the tunnel insulating layer 525 are surrounded by the conductive lines SSL and WL and the insulating layer patterns ILD1 to ILD6. The conductive lines SSL and WL and the insulating layer patterns ILD1 to ILD6 are alternately stacked in an extending direction of the second vertical channel layer CH2.

The conductive lines DSL, WL, and SSL are formed as a conductive layer 585. The insulating layer patterns ILD1 and ILD6 are formed as an insulating layer 560, and may be formed of an oxide layer or a nitride layer. The conductive lines in at least one layer from a topmost layer among the conductive lines SSL, DSL, and WL may be used as select lines SSL and DSL of select transistors and the conductive lines under the select lines SSL and DSL may be used as word lines WL of memory cells.

Charge storing layer patterns 523P are formed between the tunnel insulating layer 525 and the conductive lines DSL, WL, and SSL. The charge storing layer patterns 523P are isolated by the insulating layer patterns ILD1 to ILD6 and are extend in one direction. The extension direction of the charge storing layer patterns 523P may be the same as that of the vertical channel layer CH. The charge storing layer patterns 523P adjacent to the conductive lines DSL, WL, and SSL may be formed of the same material layer as that of the charge storing layer pattern 523 surrounding the pipe gate PG, and may be formed of a silicon nitride layer in which the charge trap is possible.

Blocking insulation layers 580 are further formed between the charge storing layer patterns 523P and the conductive lines DSL, WL, and SSL. The blocking insulation layers 580 may be further formed between the insulating layer patterns ILD1 to ILD6 and the conductive lines DSL, WL and SSL. The blocking insulation layer 580 may be further formed of a silicon oxide layer.

An insulating layer 590 is further formed between the first and second vertical channel layers CH1 and CH2. The insulating layer 590 may be formed of an oxide layer.

Select transistors are formed in intersections between the select lines DSL and SSL and the vertical channel layers CH1 and CH2, and the memory cells are formed in intersections between the word lines WL and the vertical channel layers CH1 and CH2. Accordingly, the memory cells between the select transistors are connected in series by the first vertical channel layer CH1, the pipe channel layer CHP, and the second vertical channel layer CH2, thereby being capable of configuring a U-shaped memory string.

The semiconductor device according to the fifth embodiment of the present invention may be formed the following process.

First, the insulating layer 503 is formed on the substrate 501. The conductive layer 505 for forming the pipe gate PG is formed on the insulating layer 503. A pipe trench 507 is formed by partially etching the conductive layer 505 and an inside of the pipe trench 507 is filled with a sacrificial layer (not shown).

Next, a pair of channel holes configured to expose the sacrificial layer inside the pipe trench 507 is formed by performing the same process as that described with reference to FIG. 1A. The sacrificial layer exposed through the pair of channel holes is removed by an etching process. Accordingly, the pipe trench 507 is opened.

Then, a structure formed on the pipe gate PG may be formed by performing the same processes as those described with reference to FIGS. 1B to 1H. The blocking insulating layer pattern 521, the charge storing layer pattern 523, and the tunnel insulating layer 525 are formed even on the surface of the pipe trench 507 in the step of forming the first blocking insulation layer, the charge storing layer, and the tunnel insulating layer aforementioned with reference to FIG. 1B. Further, the pipe channel layer CHP is formed inside the pipe trench 507 in the step of forming the channel layer aforementioned with reference to FIG. 1B.

Figure 6:
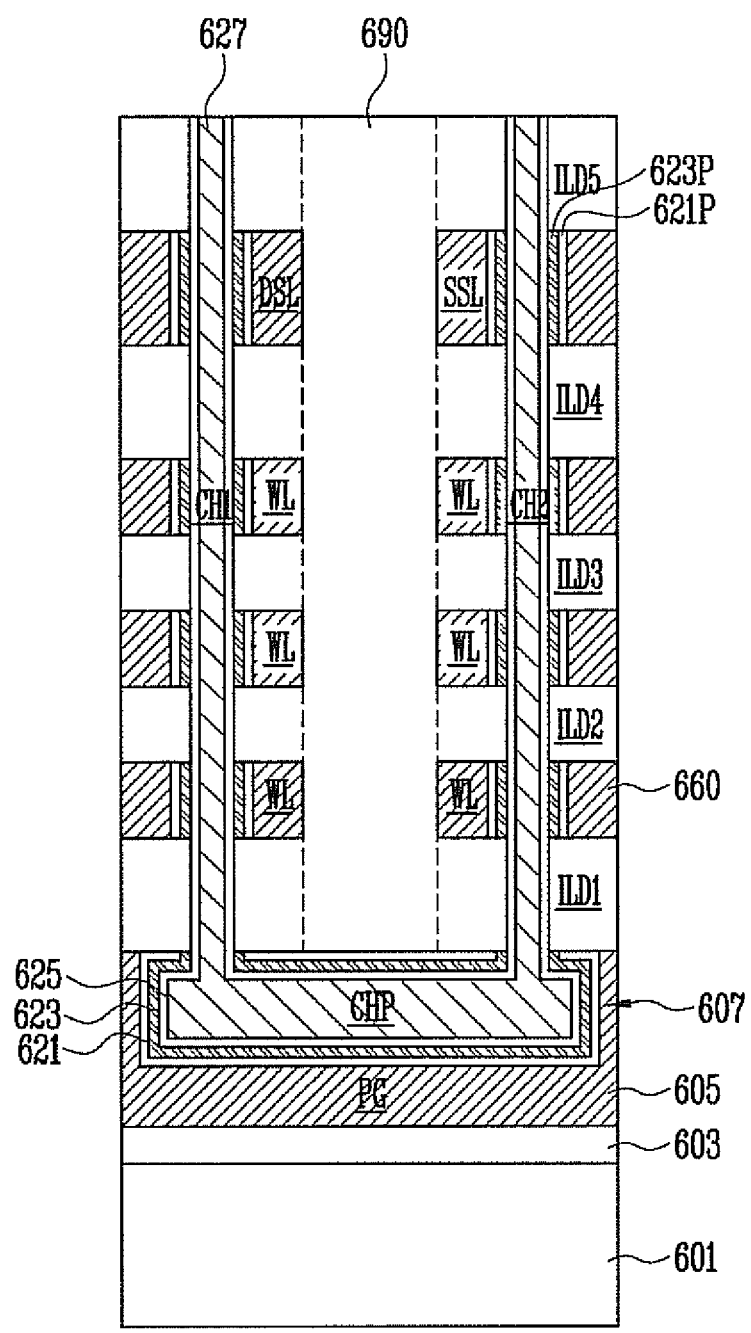
FIG. 6 is a cross-sectional view illustrating a semiconductor device and a method of manufacturing the semiconductor device according to a sixth embodiment of the present invention.

FIG. 6 is a cross-sectional view illustrating semiconductor device and a method of manufacturing the semiconductor device according to a sixth embodiment of the present invention.

Referring to FIG. 6, an insulating material constituting the insulating layer patterns ILD1 to ILD6 and an insulating material formed between the first and second vertical channels CH1 and CH2 are formed as an identical insulating layer 690. The insulating layer 690 may be formed of an oxide layer. In the sixth embodiment of the present invention, blocking insulation layer patterns 621P are isolated by the insulating layer patterns ILD1 to ILD6 and are formed between conductive lines DSL, WL, and SSL, and charge storing layer patterns 623P. The pipe gate PG, a pipe channel layer CHP formed of a semiconductor material layer 627 inside the pipe gate PG, and surrounded by a gate insulating layer pattern including a tunnel insulating layer 625, a charge storing layer pattern 623 and a blocking insulation layer pattern 621, a pair of vertical channel layers CH1 and CH2 formed of the semiconductor material layer 627, the conductive lines DSL, WL, and SSL formed as a conductive layer 685, and the charge storing layer patterns 623P in the sixth embodiment are the same as those of the fifth embodiment.

The semiconductor device according to the sixth embodiment of the present invention may be formed the following process.

First, an insulating layer 603 is formed on a substrate 601. The conductive layer 605 for forming the pipe gate PG is formed on the insulating layer 603. A pipe trench 607 is formed by partially etching the conductive layer 605 and an inside of the pipe trench 607 is filled with a sacrificial layer (not shown).

Next, a pair of channel holes configured to expose the sacrificial layer inside the pipe trench 607 is formed by performing the same process as that described with reference to FIG. 1A. The sacrificial layer exposed through the pair of channel holes is removed by an etching process. Accordingly, the pipe trench 607 is opened.

Then, a structure formed on the pipe gate PG may be formed by performing the same processes as those described with reference to FIGS. 2B to 2D. The blocking insulation layer 621, the charge storing layer 623, and the tunnel insulating layer 625 are formed even on the surface of the pipe trench 607 in the step of forming the blocking insulation layer, the charge storing layer, and the tunnel insulating layer aforementioned with reference to FIG. 2A. Further, the pipe channel layer CHP is formed inside the pipe trench 607 in the step of forming the channel layer.

Figure 7:
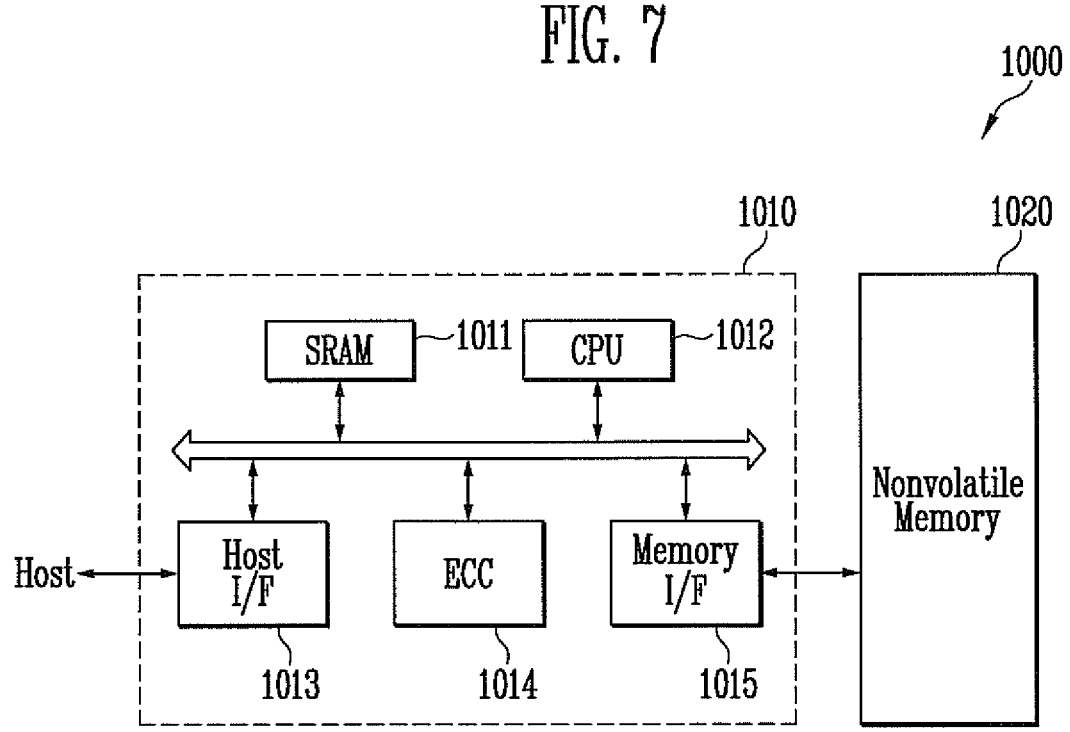
FIG. 7 is a block diagram schematically illustrating a memory system according to the present invention.

FIG. 7 is a block diagram schematically illustrating a memory system according to the present invention.

As illustrated in FIG. 7, the memory system 1000 according to the present invention includes a memory device 1020 and a memory controller 1010.

The memory device 1020 includes at least one among the semiconductor memory devices according to the first to sixth embodiments. That is, the memory device 1020 includes a channel layer extending in one direction, conductive layer patterns stacked along the channel layer while surrounding the channel layer, insulating layer patterns formed between the conductive layer patterns, and charge storing layer patterns formed between the channel layer and the conductive layer patterns and isolated by the insulating layer patterns.

The memory controller 1010 controls data exchange between a host and the memory device 1020. The memory controller 1010 may include a processing unit 1012 configured to control a general operation of the memory system 1000. Further, the memory controller 1010 may include an SRAM 1011 used as an operation memory of the processing unit 1012. In addition, the memory controller 1010 may further include a host interface 1013 and a memory interface 1015. The host interface 1013 may include a protocol for data exchange between the memory system 1000 and the host. The memory interface 1015 may establish a connection between the memory controller 1010 and the memory device 1020. Further, the memory controller 1010 may further include an error correction block ECC 1014. The error correction block 1014 may detect and correct an error of data read from the memory device 1020. Although it is not illustrated, the memory system 1000 may further include an ROM device, etc., for storing code data for interfacing with the host. The memory system 1000 may be used as a portable data storing card. Otherwise, the memory system 1000 may also be implemented as a Solid State Disk SSD capable of replacing a hard disk of a computer system.

According to the exemplary embodiments of the present invention, the charge storing layer patterns of the memory cells are formed so as to be isolated for each layer of the memory cell, so that it is possible to prevent the movement of a charge between the charge storing layer patterns of the adjacent layers, thereby being capable of improving reliability of a 3D semiconductor device.

From the foregoing, it will be appreciated that various embodiments of the present invention have been described herein for purposes of illustration, and that various modifications may be made without departing from the scope and spirit of the present invention. Accordingly, the various embodiments disclosed herein are not intended to be limiting, with the true scope and spirit being indicated by the following claims.

What is claimed is:

1. A method of manufacturing a semiconductor device, the method comprising:
alternately forming first material layers and second material layers to form a stacked structure;

forming channel holes extending through the stacked structure, the channel holes including sidewalls;

forming a charge storing layer on the side walls of the channel holes;

forming vertical channel layers, inside the channel holes, on the charge storing layer;

forming a slit by etching the stacked structure between the vertical channel layers;

forming insulating layer trenches by removing the second material layers exposed through the slit; and separating the charge storing layer into a plurality of patterns by removing portions of the charge storing layer exposed through the insulating layer trenches.

2. The method of claim 1, further comprising:

filling each of the insulating trenches with an insulating layer after separating the charge storing layer into the plurality of patterns;

forming conductive layer trenches by removing the first material layers; and filling each of the conductive layer trenches with a conductive layer.

3. The method of claim 2, further comprising:

foaming a blocking insulation layer along a surface of each of the conductive layer trenches before the filling of the conductive layer trenches with the conductive layer.

4. The method of claim 2, wherein the insulating layer is formed of a material layer having an etch selectivity to the first material layer.

5. The method of claim 2, wherein the insulating layer is a nitride layer.

6. The method of claim 1, further comprising:

forming conductive layer trenches by removing the first material layers before the forming of the insulating layer trenches; and filling each of the conductive layer trenches with a conductive layer.

7. The method of claim 6, further comprising:

filling the insulating layer trenches and the slit with an insulating layer.

8. The method of claim 7, wherein the insulating layer is an oxide layer.

9. The method of claim 1, wherein the first material layers are oxide layers and the second material layers are nitride layers.

10. The method of claim 1, further comprising:

forming a blocking insulation layer along an entire length of the side walls of the channel holes before the forming of the charge storing layer; and forming a tunnel insulating layer along an entire length of a surface of the charge storing layer before the forming of the vertical channel layer.

11. The method of claim 1, further comprising:

forming a source region on the substrate before the forming of the stacked structure, where the source region is exposed by the channel holes.

12. The method of claim 1, further comprising:

forming, on the substrate, a pipe gate conductive layer before the foaming of the stacked structure;

forming a pipe trench by etching the pipe gate conductive layer; and forming a sacrificial layer filled in the pipe trench, where the sacrificial layer is exposed by a pair of channel holes.

13. The method of claim 12, further comprising:

removing the sacrificial layer exposed through the pair of channel holes, so that the sacrificial layer is removed from the pipe trench, before forming the charge storing layer;

forming the charge storing layer on a surface of the pipe trench; and forming a pipe channel layer is formed inside the pipe trench, when the vertical channel layers are formed.

* * * * *